US006897666B2

(12) United States Patent
Swettlen et al.

(10) Patent No.: US 6,897,666 B2
(45) Date of Patent: May 24, 2005

(54) EMBEDDED VOLTAGE REGULATOR AND ACTIVE TRANSIENT CONTROL DEVICE IN PROBE HEAD FOR IMPROVED POWER DELIVERY AND METHOD

(75) Inventors: Tim Swettlen, Burlingame, CA (US); Jin Pan, Portland, OR (US); Hua Zhu, San Jose, CA (US); Jun Ding, Portland, OR (US)

(73) Assignees: Intel Corporation, Santa Clara, CA (US); Primarion, Inc., Tempe, AZ (US)

( * ) Notice: Subject to any disclaimer, the term of this patent is extended or adjusted under 35 U.S.C. 154(b) by 0 days.

(21) Appl. No.: 10/335,195

(22) Filed: Dec. 31, 2002

(65) Prior Publication Data

US 2004/0124829 A1 Jul. 1, 2004

(51) Int. Cl.[7] .............................................. G01R 31/26
(52) U.S. Cl. ....................................... 324/754; 324/765
(58) Field of Search ............................... 324/765, 754, 324/158.1, 761, 757, 762

(56) References Cited

U.S. PATENT DOCUMENTS 5,600,257 A * 2/1997 Leas et al. .................. 324/754

6,480,012 B1 * 11/2002 Komori ...................... 324/754

* cited by examiner

Primary Examiner—Evan Pert
Assistant Examiner—Tung X. Nguyen
(74) Attorney, Agent, or Firm—Schwegman, Lundberg, Woessner & Kluth, P.A.

(57) ABSTRACT

A method and apparatus for making a probe head that has reduced voltage droop and improved transient response. One embodiment a cable providing a plurality of signal conductors and a plurality of power conductors including a first power conductor and a second power conductor, a probe head wired to the cable, a plurality of electrical contacts including a first electrical contact and a second electrical contact, wherein each one of the plurality of electrical contacts is fixed to the probe head and wherein the first power conductor is connected to the first electrical contact, and a first regulatory device physically residing in the probe head and wired between the second power conductor and the first electrical contact. In some embodiments, the first regulatory device includes an active transient control device that senses an output voltage and sources or sinks an appropriate supplemental amount of current to improve transient response.

30 Claims, 8 Drawing Sheets ns that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

Terminology

The terms chip, die, integrated circuit, monolithic device, semiconductor device, and microelectronic device, are used interchangeably in this description. The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

In this description, the term metal applies both to substantially pure single metallic elements and to alloys or combinations of two or more elements at least one of which is a metallic element.

The term substrate generally refers to the physical object that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting, or combinations of semiconducting and non-semiconducting materials. In some embodiments, substrates include layered structures, such as a sheet of material chosen for electrical and/or thermal conductivity (such as copper) covered with a layer of plastic chosen for electrical insulation, stability, and embossing characteristics.

The term vertical is defined to mean substantially perpendicular to the major surface of a substrate. Height or depth refer to a distance in a direction perpendicular to the major surface of a substrate.

FIG. 1 is side view representation of a test probe head 100. One or more power supplies 110 each provide one or more power supply voltages via connections (such as wires) 111 and 112. A tester system such as tester 610 of FIG. 6 or tester 710 of FIG. 7 provides a plurality of signal connections (not shown). When testing high-power circuits 90 (such as high-speed processor circuits) on wafer 91, there can be a problem of voltage droop, such as might be caused by a sudden surge in current draw by circuit 90. Inductance in the cable wiring and the interconnections in and between printed circuit board (PCB) 140, interposer 124, and space transformer (ST) 130 contribute to the problem of voltage

EMBEDDED VOLTAGE REGULATOR AND ACTIVE TRANSIENT CONTROL DEVICE IN PROBE HEAD FOR IMPROVED POWER DELIVERY AND METHOD

FIELD OF THE INVENTION

This invention relates to the field of electronic circuit testing devices, and more specifically to a method and apparatus of a probe test head having an embedded voltage regulation module and/or an embedded active transient control device.

BACKGROUND OF THE INVENTION

Bare electronic chips typically need to be tested. Frequently, the testing is done at a wafer level after the chips have been largely fabricated, but before the chips are diced apart and packaged. Such a test is often called a wafer test and sort operation, since good chips can be sorted from bad chips that fail the test, saving time and money since the bad chips are discarded (or re-worked) before the effort of packaging the chips.

Conventional test heads used buckling-beam and/or resilient-contact technologies for the contacting pins in the probe head. Long probe lead lengths are often needed to compensate for variability in probe lengths and bent probe leads, variability in the height of the balls or bumps of the circuit being tested, and to provide gentle contact force. Unfortunately, long power-supply wiring circuits, including long probe leads have larger inductances and resistances which result in relatively large voltage droops across the leads, particularly for power-supply leads that draw large currents. Such voltage droops result in slower test speeds, thus requiring larger tester fleets to test a given quantity of chips per unit time. This can be a substantial capital cost to the chip manufacturer.

Further, voltage droops can prevent a tester from performing its tests at full speed, thus preventing the detection of faulty chips that cannot run at full speed.

What is needed is a simple, inexpensive, reliable method and apparatus to test electronic chips, so that the tester is compact and includes locally situated circuitry to reduce voltage droops and improve voltage regulation and transient suppression.

DESCRIPTION OF PREFERRED EMBODIMENTS

Figure 1:
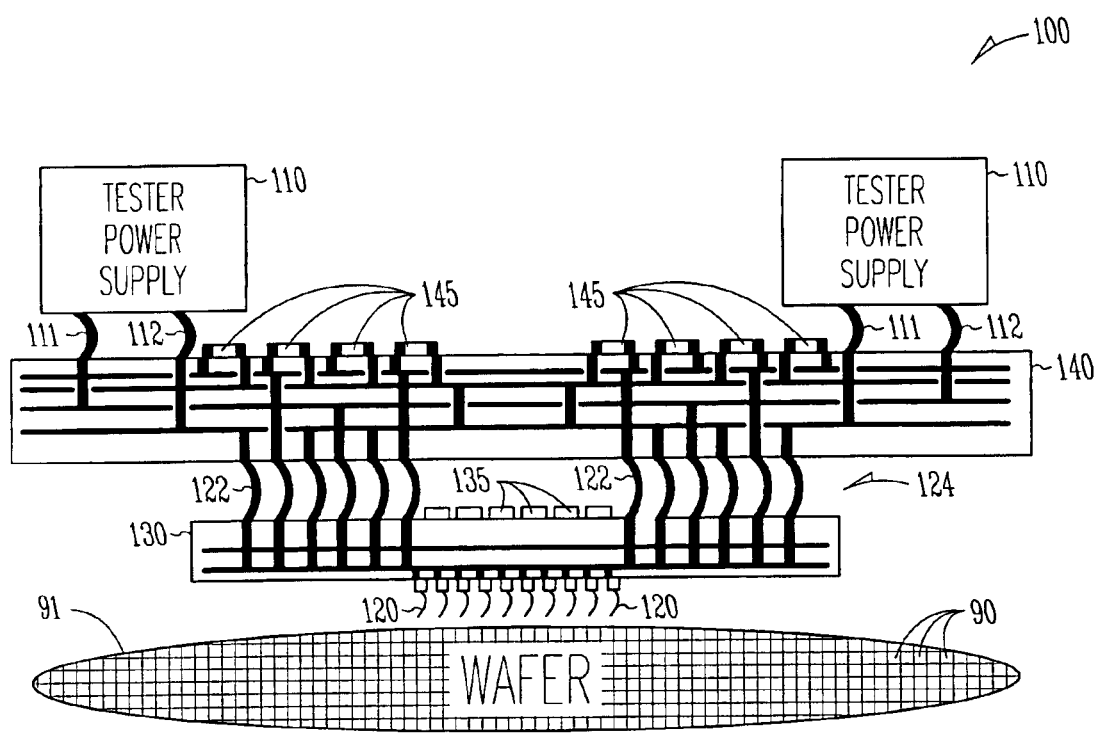
FIG. 1 is side schematic view of a test probe head 100.

In the following detailed description of the preferred embodiments, reference is made to the accompanying draw-droop. In some embodiments, interposer 124 includes a plurality of ball-grid-array (solder-ball) connections. In some embodiments, a stiffener (in some embodiments, an aluminum plate) is provided on the top (the side toward the power supplies and tester cable) of PCB 140, opposite ST 130 and approximately the size of ST 130, in order to provide mechanical rigidity and even pressure on the interposer's solder balls. Decoupling capacitors 145 provide a local storage of electrical energy at the PCB level, and decoupling capacitors 135 provide a local storage of electrical energy at the space transformer level, each of which will supply current in case of a surge in demand, and thus reduce voltage droop.

In some embodiments, the processor IC 90 being tested requires a single regulated voltage value delivered to each one of a plurality of power-supply input pins on IC 90. For example, a processor might require 1.65 volts at each of a plurality of pins. Thus, in these embodiments, all conductors 111 and 112 from each power supply 110 would each carry 1.65 volts, regulated by the respective power supplies to 1.65 volts, and an amount of electrical charge (determined by the respective capacitances of capacitors 145 and 135) at a nominal 1.65 volts would be stored in decoupling capacitors 135 and decoupling capacitors 145. However, even with decoupling capacitors 135 and decoupling capacitors 145, there is, for some embodiments, voltage droop (see graph line 510) of more than one-third of a volt for a short period of time (e.g., 355 millivolts at three to four nanoseconds) after a given arbitrary surge in current demand. Thus, there is a need for improved voltage regulation for such a probe head.

Figure 2:
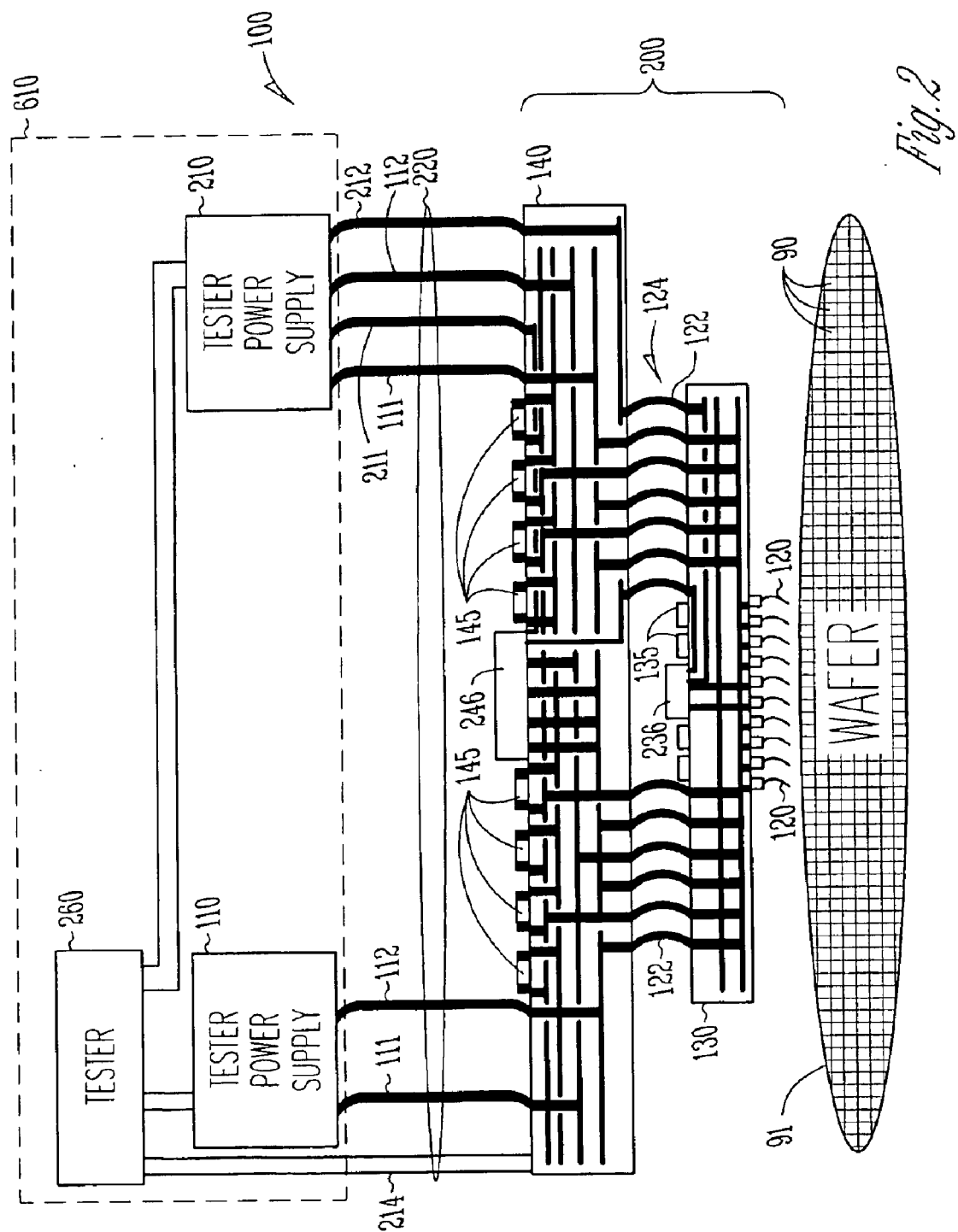
FIG. 2 is side schematic view of an improved test probe head 200.

FIG. 2 is side view representation of an improved test probe head 200, according to some embodiments of the invention. Probe head 200 is much the same as probe head 100 and would be connected to tester system 260 via cable 220. Cable 220 includes a plurality of signal conductors 211, as well as power conductors 111 and 112 from tester power supplies 110 and 210. In addition, one or more additional power conductors 211 and/or 212 are provided to supply power to VRM 246 and ATCD 236 described below. In some embodiments, substrate 140 is a printed circuit board, while in other embodiments substrate 140 is any other suitable substrate for conductive traces, such as a flexible circuit or a multiple-layer ceramic, and in yet other embodiments substrate 140 is omitted and cable 220 is wired directly to space transformer 130, and all component shown in FIG. 2 as mounted on PCB 140 are instead mounted to space transformer 130 and/or cable 220. In some embodiments, space transformer 130 is a multiple-layer ceramic (MLC) substrate, while in other embodiments, this substrate is any other suitable substrate, such as a printed circuit board or flexible circuit (e.g., in some embodiments, a direct extension of cable 220) having a suitable stiffener to support pins 120 (for example).

As with some embodiments of probe head 100, some embodiments of probe head 200 include one or more decoupling capacitors 145 mounted on PCB 140, and one or more decoupling capacitors 135 mounted on ST 130. In some embodiments, probe head 200 also includes one or more voltage-regulator modules (VRMs) 246 physically mounted directly on PCB 140. In some embodiments (not shown), one or more VRMs 246 are mounted on ST 130 (either in addition to those mounted on PCB 140 or instead of mounting VRMs on the PCB 140). Each VRM 246 provides active voltage regulation in the immediate vicinity of chips 90 (i.e., the device under test or DUT), thus reducing the effect of inductance in the wiring between the power supplies 110 and 210 and the probe head 200, and in the outlying wiring on PCB 240. In other embodiments, no VRM is used.

Figure 7:
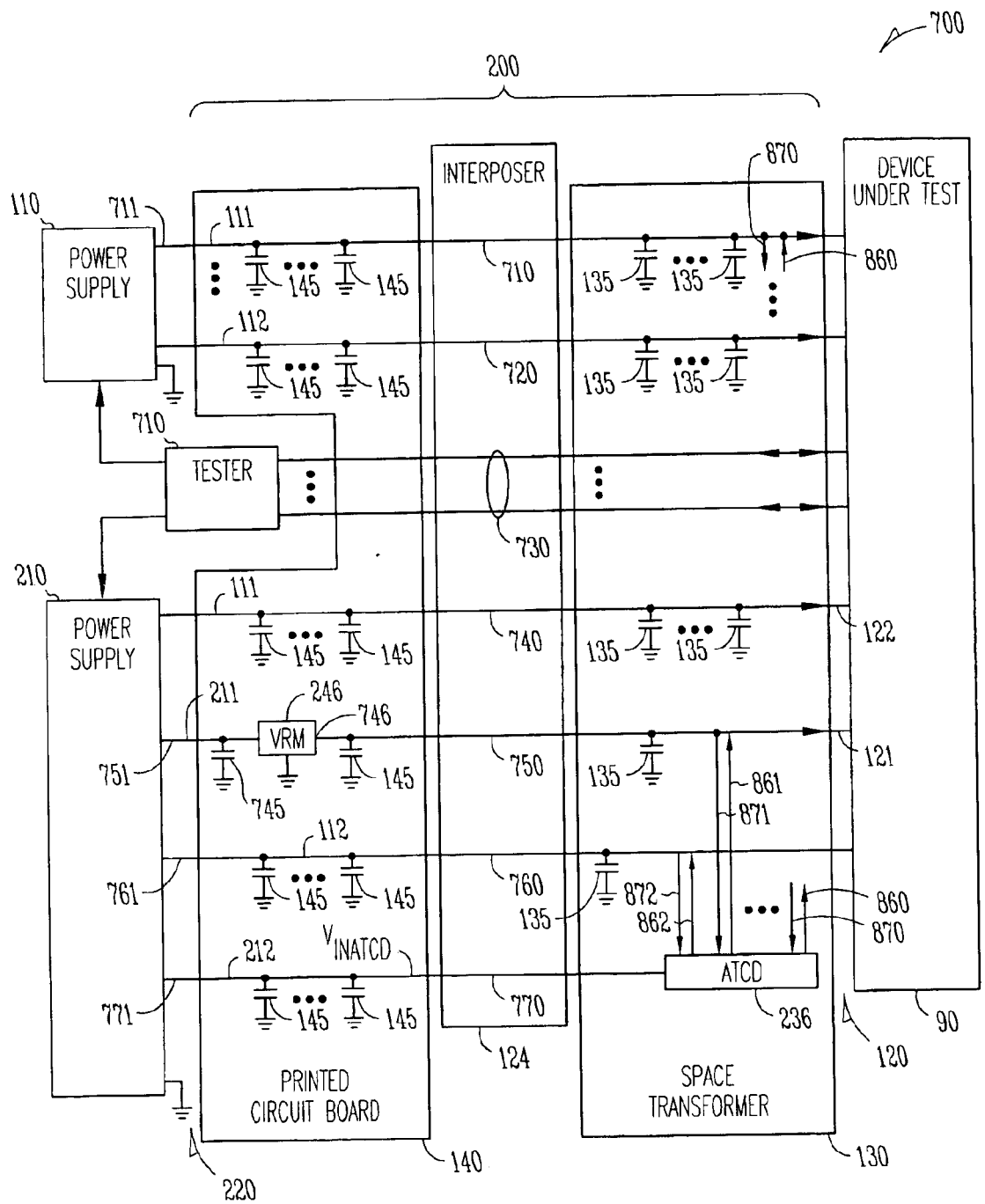
FIG. 7 is a block diagram schematic of a circuit 700 used in a probe head 200.

In some embodiments, the function of each VRM 246 is to take a relatively high voltage input (such as 3, 5, or 12 volts, for example), and generate a regulated voltage needed by the ICs 90 (such as 1.65 volts, for example) using only power from the relatively high voltage input (see one exemplary circuit in FIG. 7, for example). In some embodiments, each VRM 246 is connected to a power supply conductor 211, as shown in FIG. 2, that supplies a suitable high voltage (i.e., suitable higher than the desired output voltage to by supplied to IC 90 on a pin 120).

Figure 8:
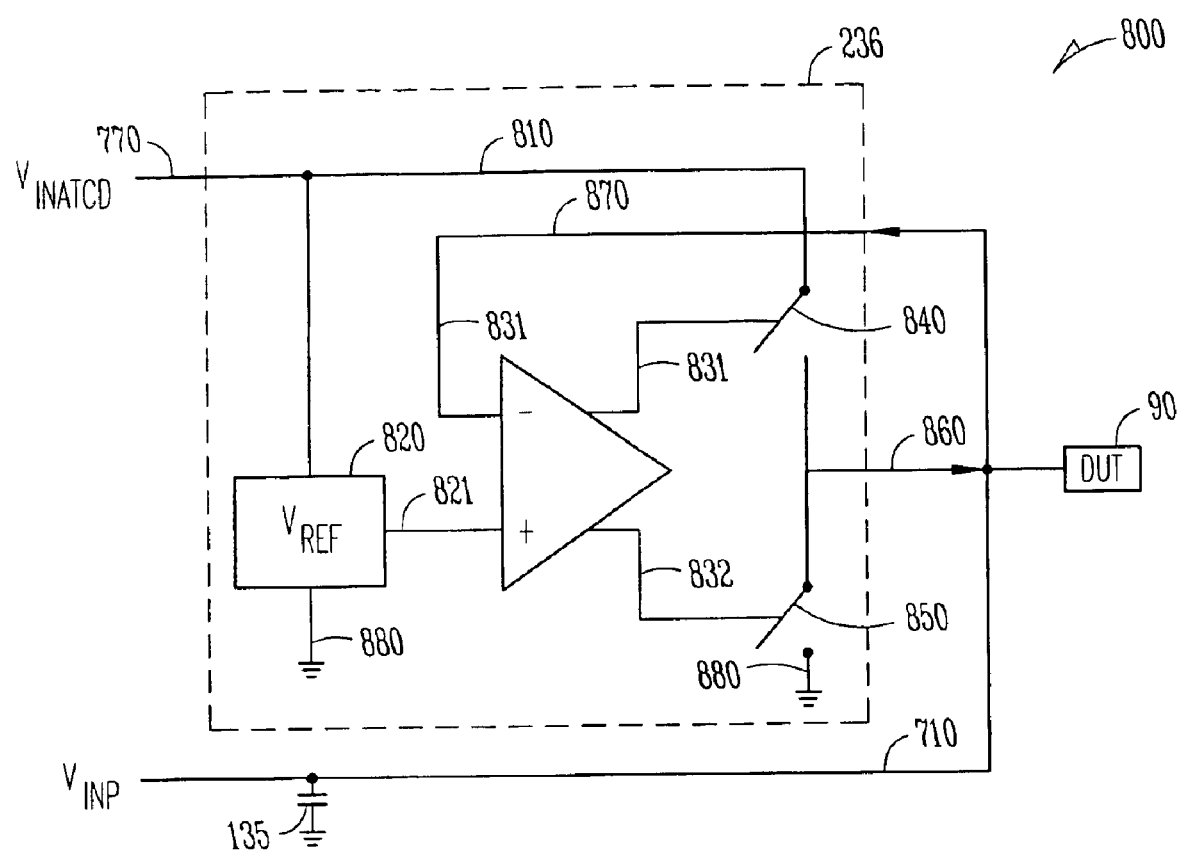
FIG. 8 is a block diagram schematic of a circuit 800 used in an ATCD 236 in a probe head 200.

In some embodiments, probe head 200 includes one or more active transient control devices (ATCDs) 236 mounted directly onto space transformer 130, in order that sensing traces and power traces are shortened. In other embodiments, one or more ATCDs are mounted elsewhere in probe head 200, for example on PCB 140. FIG. 8, described below, shows a block diagram of an ATCD 236. Such devices are available from such companies as Primarion of Tempe Arizona. An ATCD 236 is designed to reduce short-duration spikes or droops, whereas an upstream VRM 246 or one or more voltage regulators in power supplies 110 or 210 handle longer-term current requirements. Very high speed circuits, such as a Pentium 4® processor, can create very high di/dt transient loads (for example, when a 64-bit bus changes from all zeros to all ones, or other normal operations that require large internal capacitances to charge or discharge). Because of inherent line inductances between the power supply (e.g., 210) and the circuit 90, the power supply cannot react quickly enough to suppress these transients (also called spikes, ringing or bounce). Such transients, if severe enough, cause data errors in one or more bits (either the voltage of the bit does not meet margin requirements, or the timing of the bit is delayed such that a latching error occurs, or both).

Note that the reduction in transient voltage droop also allows the chip 90 to be tested at a higher frequency, since otherwise voltage droop would require a delay in clock and signal timing for the tester 610 (FIG. 6) to wait for the droop to go away. This allows the tester 610 (FIG. 6) to distinguish chips whose fault is that they run too slowly.

Note that the function of an ATCD 236, in some embodiments, is different from the function of a VRM 246, in that the primary current source for the output pin 120 is a voltage regulator upstream (such as VRM 246 or a voltage regulator in tester power supply 110 or 210). ATCD 236 sources or sinks current only for short-term transients, while counting on an upstream voltage regulator to adjust for other (slower or longer-term) changes in demand for current. It does this by sensing a voltage at or very near its respective pin 120 (e.g., comparing it to an internal reference voltage), and, based on the comparison, either (A.) sourcing current from its relatively higher power input voltage (e.g., from conductor 212) if the output voltage is too low, (B.) sinking current to a ground conductor voltage if the output voltage is too high, or (C.) doing nothing (neither sourcing nor sinking current) if the output voltage is just right (ideally, this is most of the time, since large surges occur only occasionally). In some embodiments, each ATCD 236 is connected to a power supply conductor 212, as shown in FIG. 2, that supplies a suitable high voltage (i.e., suitable higher than the desired output voltage to by supplied to IC 90 on a pin 120). In some embodiments, the ATCD 236 provides reduced voltage droop and reduces ringing at a lower power dissipation in the probe head 200 than is possible using VRMs 246, since most of the current supplied is regulated in the source power supplies (e.g., providing a small transient current during spikes, with the current source switch and the current sink switch both turned off most of the time). In contrast, when a VRM is supplying a moderate amount of current, it must dissipate as heat the remaining voltage drop that it provides to output its regulated voltage.

Thus, in some embodiments, either a VRM 246 and/or an ATCD 236 would be located (e.g., connected by a surface-mount solder technique) in probe head 200. In some embodiments, either or both are provided on PCB 140. In some embodiments, either or both are provided on ST 130.

Figure 3:
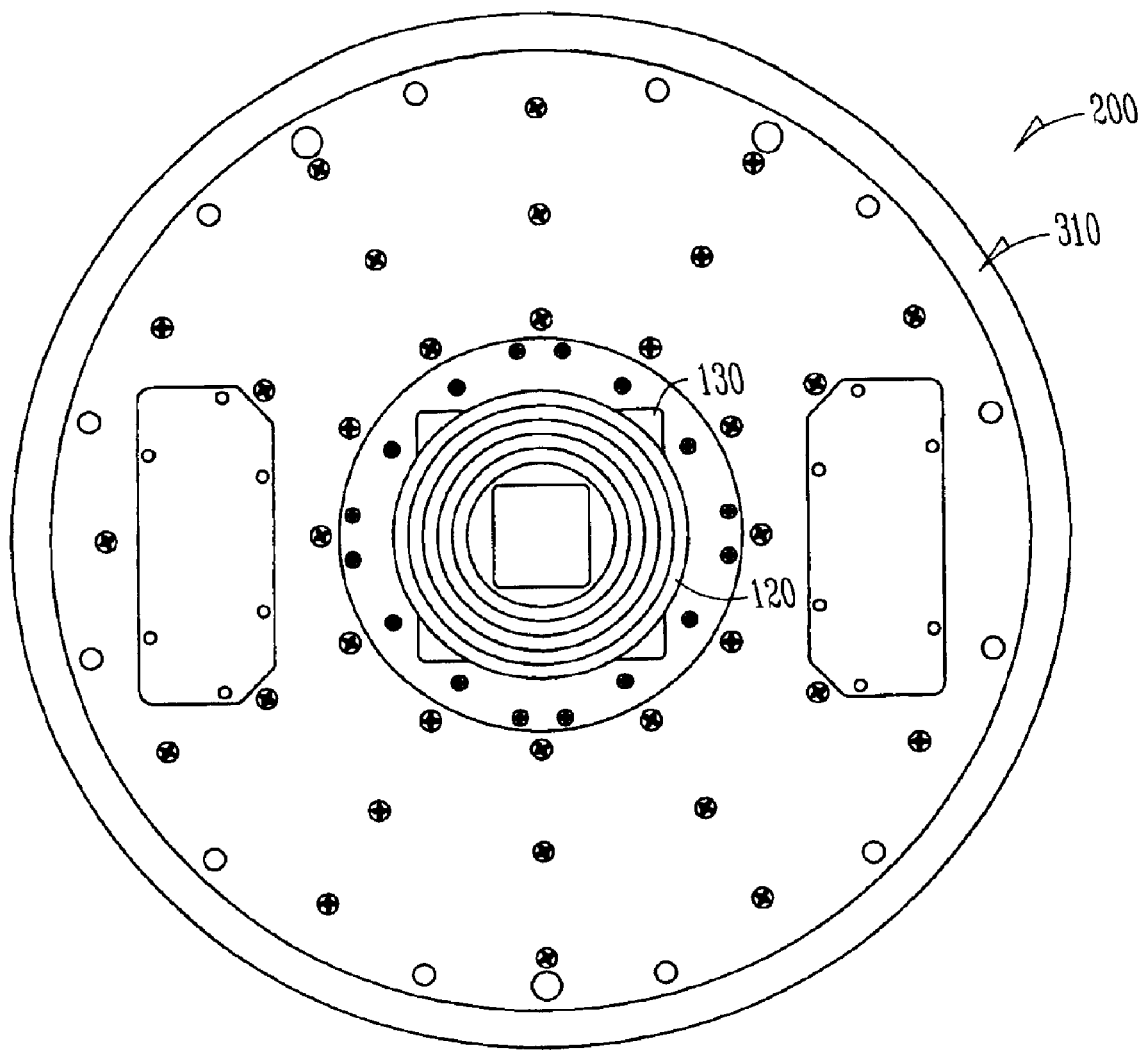
FIG. 3 is a bottom-view diagram of probe head 200.

FIG. 3 is a bottom-view diagram of probe head 200. In this embodiment, metal fixture 310 holds a space transformer 130 with exposed pins 120 in the center.

Figure 4:
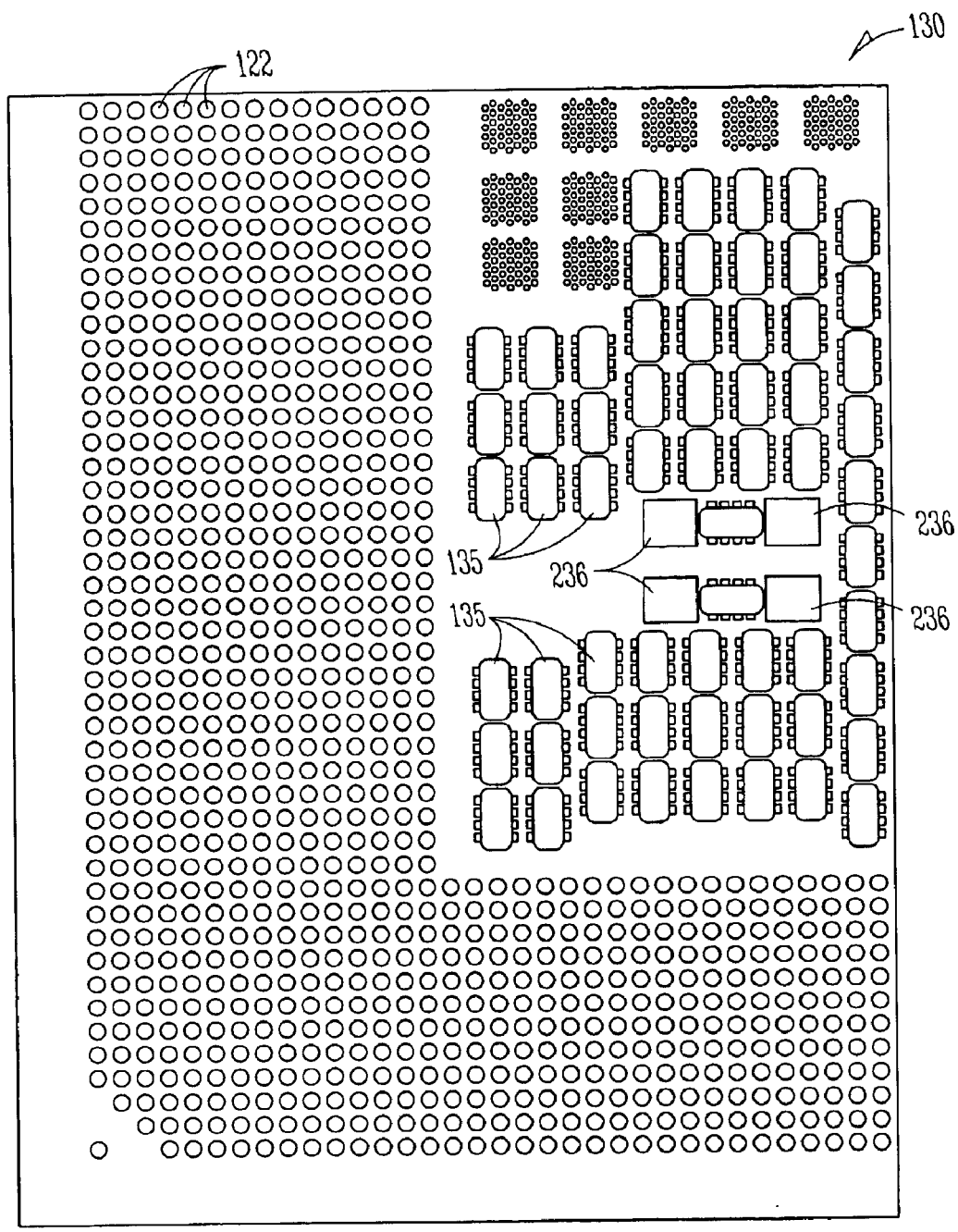
FIG. 4 is a top-view diagram of a space transformer 130 of a probe head 200.

FIG. 4 is a top-view diagram of a space transformer 130 used in a probe head 200. In the embodiment shown, the plurality of solder-ball connectors 122 will become interposer 124 of FIG. 2. A plurality of surface-mount capacitors 135 soldered to ST 130 provides significant energy storage within the probe head 200, reducing voltage droops and spikes. One or more ATCDs 236 also soldered to ST 130 provide active transient suppression the probe head 200, further reducing voltage droops and spikes. In other embodiments, one or more VRMs 236 are also (or alternatively) soldered to ST 130, each to provide a regulated voltage.

Figure 5:
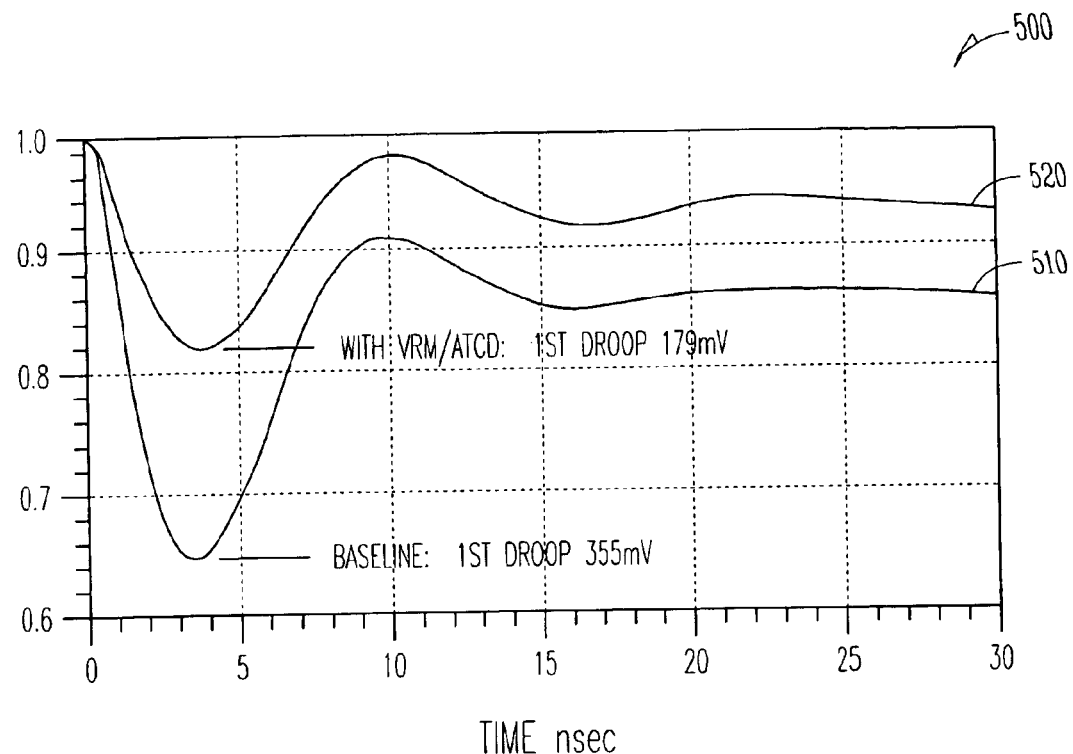
FIG. 5 is a graph of a simulation result for probe head 100 and probe head 200.

FIG. 5 is a graph of a simulation result for probe head 100 and probe head 200. An arbitrary step current draw is applied, which results in an initial drop in voltage, possibly followed by ringing (e.g., the effective parasitic inductance of the conductors and the local and parasitic capacitance can cause this damped ringing). Graph 510 shows a baseline graph in a probe head 100 using only decoupling capacitors 135 and 145. For the component values and value of the current step used in this simulation, a voltage droop of 355 mV was obtained from the simulation. For similar component and current step values, but with the VRM and ATCD included in the circuit, the graph line 520 (having a first droop of only 179 mV) was obtained from simulation. For other embodiments, a sufficient amount of local capacitance, and a sufficiently large source switch and source voltage for the ATCD, are provided to compensate for the parasitic inductance of the pins 120 and internal traces and to obtain a sufficiently small first voltage droop.

Figure 6:
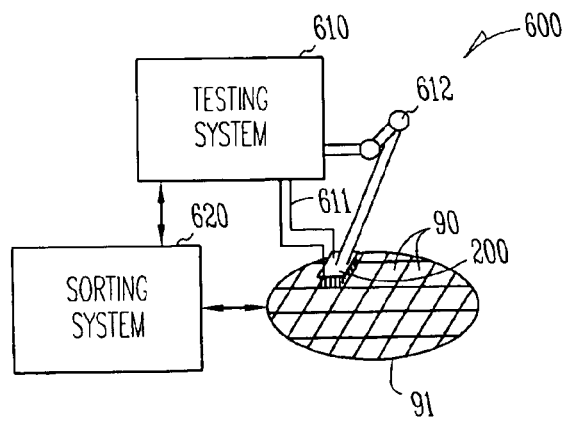
FIG. 6 is a perspective-view schematic diagram of a system 600 that uses one or more probe heads 200.

FIG. 6 is a perspective-view schematic diagram of a system 600 that uses one or more probe heads 200. Each probe head 200 is connected by cable 611 to testing system 610. In some embodiments, testing system 610 (such as a computer) operates a robotic arm 612 that moves probe head 200 into position on a successive series of chips 90 of wafer 91. Electrical stimulation signals are sent through some of the pins 120, power is supplied through pins 120 and/or 180, and electrical results signals are obtained from other pins 120, and the results compared to expected results by testing system 610 for each chip tested. In some embodiments, a sorting system 620 receives results from testing system 610, and based on those results, sorts the good chips from the faulty ones.

FIG. 7 is a block diagram schematic of a circuit 700 used in a probe head 200. In the embodiment shown, the circuit for power supply conductor line 710 (as well as for power supply conductor 760) includes one or more capacitors 145 surface-mount soldered on PCB 140, a pass-through (e.g., via a solder ball in a ball-grid-array connection scheme) connection in interposer 124, one or more capacitors 135 surface-mount soldered on ST 130, and a sense line 870 and a current source/sink line 860 going to an ATCD 236. Since the voltage is sensed very near the device-under-test 90, and the resulting controlled current source/sink is also provided very near the device-under-test 90, good regulation is achieved. For line 760, the working voltage line 761 is supplied from the same power supply 210 as is the ATCD power supply line 771, while for line 710, its working voltage line 711 is from a different power supply 110. In some embodiments, care is taken to reduce sources of parasitic inductance, in order to further reduce voltage droop. In some embodiments, some of the power supply lines omit the ATCD regulation, such as shown for line 720 and 740.

For power supply conductor 750, the starting supply 751 is supplied by power supply 210. This goes through a conventional single-chip voltage regulation module 246, which provides all the required current at its output 746. In some embodiments, one or more capacitors 745 are used on the input voltage line 751, operating at the nominal input (unregulated) voltage level. In some embodiments, one or more capacitors 145 are used on the output voltage line 746, operating at the nominal regulated voltage value. In some embodiments, the output voltage 746 is run directly to chip 90 (optionally including one or more capacitors 135 on ST 130). In other embodiments, one or more capacitors 135 surface-mount soldered on ST 130 connect to line 750, and a sense line 871 and a current source/sink line 861 going to an ATCD 236 are also used.

Like line 710 described above, line 760 is a power supply conductor that is primarily regulated in power supply 210 (e.g., supplying 1.65 volts at one hundred amps, for example). Sense line 872 receives a voltage from very near its pin 120 and its connection to IC chip 90. Current source/sink line 862 then provides (at least some of) the necessary source/sink supplemental current to the current supplied on line 760 to IC 90. It is not necessary to supply all of the spike current, but only enough to prevent undesirable excessive voltage droop or time delay in signals.

FIG. 8 is a block diagram schematic of a circuit 800 used in an ATCD 236 in a probe head 200. Voltage reference circuit 820 provides a reference voltage 821 to control circuit 830. Sensed voltage 870 (similarly also 871 and 872 to their respective circuits) is also input to control circuit 830, and based on a comparison between the reference voltage 821 and the sensed voltage 870. In some embodiments, the control voltage 831 from controller 830 closes electronic switch 840 (e.g., in various embodiments, switch 840 is a bipolar transistor, a field-effect transistor, or other suitable switch) as needed to provide a supplemental current source to output conductor 860 connected to conductor 710 going to IC 90. In some embodiments, an amount of hysteresis is provided to reduce unnecessary conduction by switch 840. Similarly, in some embodiments, the control voltage 832 from controller 830 closes electronic switch 850 as needed to provide a supplemental current sink to ground 880 from output conductor 860 connected to conductor 710 going to IC 90. In some embodiments, an amount of hysteresis is provided for control signal 832 to reduce unnecessary conduction by switch 840.

Figure 9:
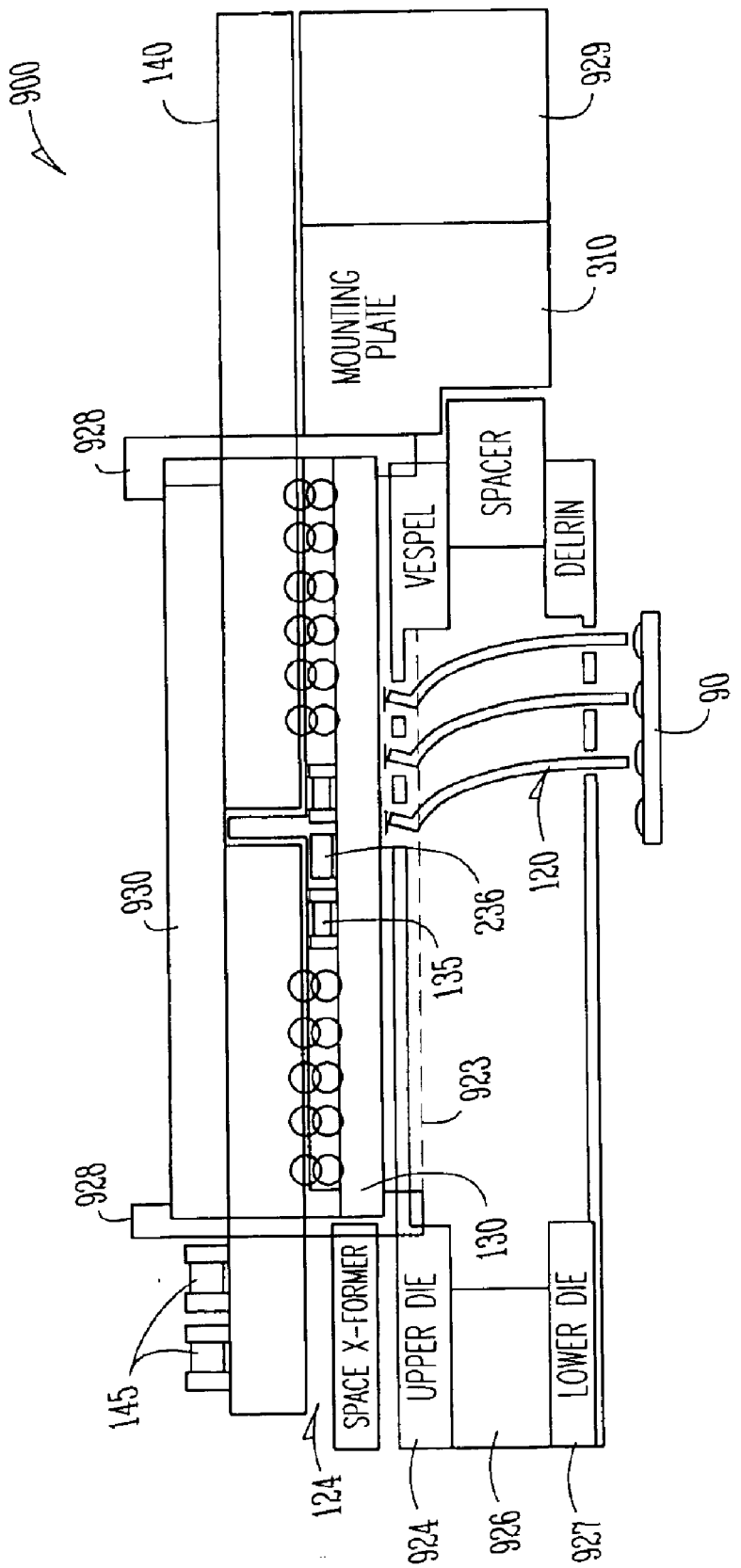
FIG. 9 is side schematic view of another improved test probe head 900.

FIG. 9 is side schematic view of another improved test probe head 900. Electrically, probe head 900 is identical to probe head 200. Shown in this embodiment, hardware clamps 928 hold space transformer 130 to top-side stiffening hardware 930. Pins 120 are supported by lower die 927 (in some embodiments, made of Delrin® brand acetal-resin plastic), spacer 926, upper die 924 (in some embodiments, made of Vespel® brand polyimide plastic), and perforated layer 923( (in some embodiments, made of Mylar® brand polyester plastic). This assembly is mounted to mounting plate 310 and stiffening hardware 929.

Conclusion

One embodiment of the present invention includes an apparatus 700 that includes a cable 220 providing a plurality of signal conductors 730 and a plurality of power conductors including a first power conductor 112 and a second power conductor 212, a probe head 200 wired to the cable 220, a plurality of electrical contacts 120 including a first electrical contact 121 and a second electrical contact 122. Each one of the plurality of electrical contacts 120 is fixed to the probe head 200. The first power conductor 112 is connected to the first electrical contact 120. The apparatus includes a first regulatory device 246 or 236 physically residing in the probe head and wired between the second power conductor 212 and the first electrical contact 121.

Some embodiments further include a system 600 that includes a probe head 200 including the features above, the system 600 further including one or more information-processing systems 610 that collect testing results from a plurality of integrated circuits 90 that are contacted using the probe head, and based on the testing results, sorted.

Some embodiments further include a voltage-regulator circuit 246 physically residing in the probe head and wired to the second electrical contact 122.

In some embodiments, the first regulatory device includes an active transient control device 236 including a voltage-sense input 870 connected to the first electrical contact 121, an output-supply-voltage input 810 connected to the second power conductor 212, a ground connection 880, and an output 860 connected to the first electrical contact. In some such embodiments, the active transient control device further includes a voltage reference 820, a control circuit 830 having a first input 821 connected to the voltage reference 820 and a second input 831 connected to the voltage-sense input 870, and a first electronic switch 840 connected between the output-supply-voltage input 810 and the output 860 and controlled by the control circuit 830 based on a voltage difference between a voltage of the voltage reference 820 and a voltage of the voltage-sense input 870. In some such embodiments, the active transient control device further includes a second electronic switch 850 connected between the ground connection 880 and the output 860 and controlled by the control circuit 830 based on the voltage difference between the voltage of the voltage reference 820 and the voltage of the voltage-sense input 870.

Some embodiments further include a first surface-mount capacitor 145 or 135 wired between a ground connection and the first power conductor, and a second surface-mount capacitor 145 or 135 wired between a ground connection and the second power conductor.

In some embodiments, the probe head 200 includes a printed circuit board (PCB) 140, a multiple-layer ceramic space transformer (ST) 130, and an interposer 124 connecting the PCB 140 to the ST 130, and wherein the first and second surface-mount capacitors 135 or 145 and the first regulatory device 236 or 246 are surface mounted to the ST.

In some embodiments, the cable further includes a third power conductor 112 and a fourth power conductor 212, and wherein the plurality of electrical contacts 120 further includes a third electrical contact and the third power conductor is connected to the third electrical contact, the apparatus further including a second regulatory device 236 Or 246 physically residing in the probe head 200 and wired between the fourth power conductor and the third electrical contact.

In some such embodiments, the first and second regulatory devices each include an active transient control device 236 including a voltage-sense input 870 connected to the first electrical contact 120, an output-supply-voltage input 810 connected to the second power conductor 212, a ground connection 880, an output 860 connected to the first electrical contact 120, a voltage reference 820, a control circuit 830 having a first input connected to the voltage reference 820 and a second input connected to the voltage-sense input 870, a first electronic switch 840 connected between the output-supply-voltage input 810 and the output 860 and controlled by the control circuit 830 based on a voltage difference between a voltage of the voltage reference and a voltage of the voltage-sense input, and a second electronic switch 850 connected between the ground connection 880 and the Output 860 and controlled by the control circuit 830 based on the voltage difference between the voltage of the voltage reference and the voltage of the voltage-sense input.

Some such embodiments further include a voltage-regulator circuit 246 physically residing in the probe head and wired to the second electrical contact.

Some embodiments further include a first surface-mount capacitor 135 wired between a ground connection and the first power conductor, a second surface-mount capacitor 135 wired between a ground connection and the second power conductor, a third surface-mount capacitor 135 wired between a ground connection and the third power conductor, wherein the probe head includes a printed circuit board (PCB) 140, a multiple-layer ceramic space transformer (ST) 120, and an interposer 124 connecting the PCB to the ST, and wherein the first, second, and third surface-mount capacitors 135 and the first and second regulatory devices 236 are surface mounted to the ST 120.

Some embodiments of the invention provide a method for reducing voltage transients in a probe head. This method includes providing a cable providing a plurality of signal conductors and a plurality of power conductors including a first power conductor and a second power conductor, providing a probe head wired to the cable, and providing a plurality of electrical contacts including a first electrical contact and a second electrical contact. Each one of the plurality of electrical contacts is fixed to the probe head and the first power conductor is connected to the first electrical contact. The method also includes sensing a first voltage of the first electrical contact, and driving a current from the second power conductor to the first electrical contact based on the sensed first voltage. This function can be provided by either VRM 246 or ATCD 236 or both.

Some embodiments of the method further include contacting a plurality of integrated circuits (ICs) with the probe head, collecting testing results from the plurality of integrated circuits, and based on the testing results, sorting the ICs.

Some embodiments of the method further include, from physically within the probe head, regulating a voltage of the first electrical conductor.

In some embodiments, sensing the first voltage further includes providing a first reference voltage and comparing the first voltage to the first reference voltage, and driving the first current includes electronically switching current from the second power conductor to the first electrical contact based on a voltage difference between the reference voltage and the first voltage.

In some embodiments, driving the first current includes electronically switching current from the first electrical contact to ground based on the voltage difference between the reference voltage and the first voltage.

Some embodiments of the method further include capacitively storing electrical energy between a ground connection and the first power conductor.

In some embodiments, the probe head includes a printed circuit board (PCB), a multiple-layer ceramic space transformer (ST), and an interposer connecting the PCB to the ST, and wherein capacitively storing electrical energy, and the sensing the first voltage and driving the current from the second power conductor to the first electrical contact based on the sensed first voltage are performed on the ST.

Other embodiments of the invention include an apparatus that has a cable providing a plurality of signal conductors and a plurality of power conductors including a first power conductor and a second power conductor, a probe head wired to the cable, a space-transformer substrate within the substrate, and voltage regulation means as described above on the space-transformer substrate for reducing short-term transient voltage excursions, wherein the voltage regulation means takes power from the second power conductor to control voltage transients on the first power conductor.

In some embodiments, the voltage regulator means includes active transient control means having first switching means connected between the second power conductor and the first power conductor, and second switching means between the first power conductor and ground, as described above. Some embodiments further include capacitive means for storing electrical energy in the probe head.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An apparatus comprising:
   a cable providing a plurality of signal conductors and a plurality of power conductors including a first power conductor and a second power conductor;
   a probe head wired to the cable;
   a plurality of electrical contacts including a first electrical contact and a second electrical contact, wherein each one of the plurality of electrical contacts is fixed to the probe head and wherein the first power conductor is connected to the first electrical contact; and
   a first regulatory device that physically resides in the probe head and wired between the second power conductor and the first electrical contact, wherein the first regulatory device includes an active transient control device comprising a voltage-sense input connected to the first electrical contact; an output-supply-voltage input connected to the second power conductor; a ground connection; and an output connected to the first electrical contact.

2. A system that includes a probe head comprising the apparatus of claim 1, the system further comprising one or more information-processing systems that collect testing results from a plurality of integrated circuits that are contacted using the probe head, and based on the testing results, sorted.

3. The apparatus of claim 1, further comprising a voltage-regulator circuit physically residing in the probe head and wired to the second electrical contact.

4. The apparatus of claim 1, wherein the active transient control device further comprises:
   a voltage reference;
   a control circuit having a first input connected to the voltage reference and a second input connected to the voltage-sense input; and
   a first electronic switch connected between the output-supply-voltage input and the output and controlled by the control circuit based on a voltage difference between a voltage of the voltage reference and a voltage of the voltage-sense input.

5. The apparatus of claim 4, wherein the active transient control device further comprising:
   a second electronic switch connected between the ground connection and the output and controlled by the control circuit based on the voltage difference between the voltage of the voltage reference and the voltage of the voltage-sense input.

6. The apparatus of claim 1, further comprising:
   a first surface-mount capacitor wired between a ground connection and the first power conductor; and
   a second surface-mount capacitor wired between a ground connection and the second power conductor.

7. The apparatus of claim 1, wherein the probe head comprises:
   a printed circuit board (PCB);
   a multiple-layer ceramic space transformer (ST); and
   an interposer connecting the PCB to the ST; and wherein the first and second surface-mount capacitors and the first regulatory device are surface mounted to the ST.

8. An apparatus comprising:
   a cable to provide a plurality of signal conductors and a plurality of power conductors including a first power conductor and a second power conductor, wherein the cable further includes a third power conductor and a fourth power conductor;
   a probe head wired to the cable;
   a plurality of electrical contacts including a first electrical contact and a second electrical contact, wherein each one of the plurality of electrical contacts is fixed to the probe head and wherein the first power conductor is connected to the first electrical contact, and wherein the plurality of electrical contacts further includes a third electrical contact and the third power conductor is connected to the third electrical contact;
   a first regulatory device physically that resides in the probe head and wired between the second power conductor and the first electrical contact; and
   a second regulatory device that physically resides in the probe head and wired between the fourth power conductor and the third electrical contact.

9. The apparatus of claim 8, wherein the first and second regulatory devices each includes an active transient control device comprising:
   a voltage-sense input connected to the first electrical contact;
   an output-supply-voltage input connected to the second power conductor;
   a ground connection;
   an output connected to the first electrical contact;
   a voltage reference;
   a control circuit having a first input connected to the voltage reference and a second input connected to the voltage-sense input;
   a first electronic switch connected between the output-supply-voltage input and the output and controlled by the control circuit based on a voltage difference between a voltage of the voltage reference and a voltage of the voltage-sense input; and
   a second electronic switch connected between the ground connection and the output and controlled by the control circuit based on the voltage difference between the voltage of the voltage reference and the voltage of the voltage-sense input.

10. The apparatus of claim 9, further comprising a voltage-regulator circuit physically residing in the probe head and wired to the second electrical contact.

11. The apparatus of claim 9, further comprising:
a first surface-mount capacitor wired between a ground connection and the first power conductor;
a second surface-mount capacitor wired between a ground connection and the second power conductor; and
a third surface-mount capacitor wired between a ground connection and the third power conductor;
and wherein the probe head comprises:
a printed circuit board (PCB);
a multiple-layer ceramic space transformer (ST); and
an interposer connecting the PCB to the ST; and wherein the first, second, and third surface-mount capacitors and the first and second regulatory devices are surface mounted to the ST.

12. A method for reducing voltage transients in a probe head, the method comprising:
providing a cable providing a plurality of signal conductors and a plurality of power conductors including a first power conductor and a second power conductor;
providing a probe head wired to the cable;
providing a plurality of electrical contacts including a first electrical contact, wherein each one of the plurality of electrical contacts is fixed to the probe head and wherein the first power conductor is connected to the first electrical contact;
sensing a first voltage of the first electrical contact, wherein the sensing the first voltage further comprises providing a first reference voltage and comparing the first voltage to the first reference voltage; and
driving a current from the second power conductor to the first electrical contact based on the sensed first voltage, wherein driving the first current includes electronically switching current from the second power conductor to the first electrical contact based on a voltage difference between the reference voltage and the first voltage.

13. The method of claim 12, further comprising:
contacting a plurality of integrated circuits (ICs) with the probe head;
collecting testing results from the plurality of integrated circuits; and
based on the testing results, sorting the ICs.

14. The method of claim 12, further comprising:
from physically within the probe head, regulating a voltage of the first electrical conductor.

15. The method of claim 12, wherein the driving the first current includes electronically switching current from the first electrical contact to ground based on the voltage difference between the reference voltage and the first voltage.

16. A method for reducing voltage transients in a probe head, the method comprising:
providing a cable providing a plurality of signal conductors and a plurality of power conductors including a first power conductor and a second power conductor;
providing a probe head wired to the cable;
providing a plurality of electrical contacts including a first electrical contact, wherein each one of the plurality of electrical contacts is fixed to the probe head and wherein the first power conductor is connected to the first electrical contact;

sensing a first voltage of the first electrical contact; and
driving a current from the second power conductor to the first electrical contact based on the sensed first voltage; and
capacitively storing electrical energy between a ground connection and the first power conductor, wherein the probe head comprises:
a printed circuit board (PCB);
a multiple-layer ceramic space transformer (ST); and
an interposer connecting the PCB to the ST; and wherein capacitively storing electrical energy, and the sensing the first voltage and the driving the current from the second power conductor to the first electrical contact based on the sensed first voltage are performed on the ST.

17. The method of claim 16, further comprising:
contacting a plurality of integrated circuits (ICs) with the probe head;
collecting testing results from the plurality of integrated circuits; and
sorting the ICs based on the testing results.

18. The method of claim 16, further comprising:
from physically within the probe head, regulating a voltage of the first electrical contact.

19. The method of claim 16, wherein the sensing the first voltage further comprises providing a first reference voltage and comparing the first voltage to the first reference voltage; and wherein driving the first current includes electronically switching current from the first electrical contact to ground based on the voltage difference between the reference voltage and the first voltage.

20. An apparatus comprising:
a cable providing a plurality of signal conductors and a plurality of power conductors including a first power conductor and a second power conductor;
a probe head wired to the cable;
a space-transformer substrate within the substrate; and
voltage regulation means on the space-transformer substrate for reducing short-term transient voltage excursions, wherein the voltage regulation means takes power from the second power conductor to control voltage transients on the first power conductor, wherein the voltage regulation means includes active transient control means having first switching means connected between the second power conductor and the first power conductor, and second switching means between the first power conductor and ground.

21. The apparatus of claim 20, further comprising capacitive means for storing electrical energy in the probe head.

22. The apparatus of claim 21, wherein the capacitive means comprises:
a first surface-mount capacitor wired between ground and the first power conductor; and
a second surface-mount capacitor wired between ground and the second power conductor.

23. A system comprising:
an apparatus that includes:
a cable to provide a plurality of signal conductors and a plurality of power conductors including a first power conductor and a second power conductor;
a probe head wired to the cable;
a plurality of electrical contacts including a first electrical contact and a second electrical contact, wherein each one of the plurality of electrical contacts is fixed to the probe head and wherein the first power conductor is connected to the first electrical contact; and a first regulatory device physically that resides in the probe head and wired between the second power conductor and the first electrical contact, wherein the first regulatory device includes an active transient control device comprising a voltage-sense input connected to the first electrical contact; an output-supply-voltage input connected to the second power conductor; a ground connection; and an output connected to the first electrical contact; and a testing system coupled to the probe head to control the probe head to test a number of integrated circuits on a substrate.

24. The system of claim 23, wherein the testing system is coupled to the probe head through a robotic arm.

25. The system of claim 23, further comprising a sorting system to sort the number of integrated circuits based on the test by the probe head.

26. The system of claim 23, wherein the apparatus further comprises a voltage-regulator circuit physically residing in the probe head and wired to the second electrical contact.

27. The system of claim 23, wherein the active transient control device further comprises:

a voltage reference;

a control circuit having a first input connected to the voltage reference and a second input connected to the voltage-sense input; and a first electronic switch connected between the output-supply-voltage input and the output and controlled by the control circuit based on a voltage difference between a voltage of the voltage reference and a voltage of the voltage-sense input.

28. The system of claim 27, wherein the active transient control device further comprising:

a second electronic switch connected between the ground connection and the output and controlled by the control circuit based on the voltage difference between the voltage of the voltage reference and the voltage of the voltage-sense input.

29. The system of claim 23, wherein the apparatus further comprises:

a first surface-mount capacitor wired between a ground connection and the first power conductor; and a second surface-mount capacitor wired between a ground connection and the second power conductor.

30. The system of claim 23, wherein the probe head comprises:

a printed circuit board (PCB);

a multiple-layer ceramic space transformer (ST); and an interposer connecting the PCB to the ST; and wherein the first and second surface-mount capacitors and the first regulatory device are surface mounted to the ST.

* * * * *

UNITED STATES PATENT AND TRADEMARK OFFICE
CERTIFICATE OF CORRECTION

PATENT NO.   : 6,897,666 B2
DATED        : May 24, 2005
INVENTOR(S)  : Swettlen et al.

It is certified that error appears in the above-identified patent and that said Letters Patent is hereby corrected as shown below:

Title page,
Item [75], Inventors, insert -- ; Kenneth A. Ostrom, Palos Verdes Estates, CA (US); Laura L. Carpenter, Palos Verdes Estates, CA (US); Clifford N. Duong, Fountain Valley, CA (US) -- after "OR (US)".

Signed and Sealed this

Twenty-fifth Day of October, 2005

JON W. DUDAS
*Director of the United States Patent and Trademark Office*